United States Patent
McReynolds

(10) Patent No.: US 6,569,607 B2
(45) Date of Patent: May 27, 2003

(54) MULTI DEPTH SUBSTRATE FABRICATION PROCESSES

(75) Inventor: Richard J. McReynolds, San Jose, CA (US)

(73) Assignee: Caliper Technologies Corp., Mountain View, CA (US)

( * ) Notice: Subject to any disclaimer, the term of this patent is extended or adjusted under 35 U.S.C. 154(b) by 21 days.

(21) Appl. No.: 09/846,679

(22) Filed: May 1, 2001

(65) Prior Publication Data
US 2002/0004182 A1 Jan. 10, 2002

Related U.S. Application Data
(60) Provisional application No. 60/201,504, filed on May 30, 2000.

(51) Int. Cl.[7] .............................. G03F 7/00; H01L 21/00
(52) U.S. Cl. ........................ 430/322; 430/312; 430/394; 216/80; 216/97
(58) Field of Search ................................ 430/312, 316, 430/322, 323, 394; 216/80, 97; 438/723

(56) References Cited

U.S. PATENT DOCUMENTS

| | | | |
|---|---|---|---|
| 3,839,113 A | 10/1974 | Yoshida et al. | 216/92 |
| 4,797,316 A | 1/1989 | Hecq et al. | 204/192 |
| 5,143,854 A | 9/1992 | Pirrung et al. | 435/7.92 |
| 5,198,073 A | 3/1993 | Ishibashi | 216/100 |
| 5,413,884 A * | 5/1995 | Koch et al. | 430/321 |
| 5,753,417 A * | 5/1998 | Ulrich | 430/312 |
| 5,779,868 A | 7/1998 | Parce et al. | 204/451 |
| 5,821,169 A * | 10/1998 | Nguyen et al. | 216/41 |
| 5,842,787 A | 12/1998 | Kopf-Sill et al. | 138/42 |
| 5,942,443 A | 8/1999 | Parce et al. | 204/451 |
| 5,955,221 A | 9/1999 | Sanders et al. | 359/15 |
| 5,972,570 A | 10/1999 | Bruce et al. | 430/313 |
| 5,976,336 A | 11/1999 | Dubrow et al. | 204/453 |
| 6,007,324 A | 12/1999 | Tzu et al. | 430/394 |
| 6,042,709 A | 3/2000 | Parce et al. | 204/450 |
| 6,093,507 A * | 7/2000 | Tzu | 430/323 |

FOREIGN PATENT DOCUMENTS

| | | |
|---|---|---|
| JP | 07-186155 | 7/1995 |
| WO | WO 98/00231 | 1/1998 |
| WO | WO 98/55852 | 12/1998 |

OTHER PUBLICATIONS

Dasgupta, P.K. et al., "Electroosmosis: A Reliable Fluid Propulsion System for Flow Injection Analysis," *Anal. Chem.* 66:1792–1798 (1994).

Ghandhi, S.K., "Lithographic Processes," *VLSI Fabrication Principles*, Chapter 10, John Wiley & Sons, New York (1994).

Jacobson, S.C. et al., "Fused Quartz Substrates for Microchip Electrophoresis," *Anal. Chem.* 67:2059–2063 (1995).

(List continued on next page.)

*Primary Examiner*—Mark F. Huff
*Assistant Examiner*—Kripa Sagar
(74) *Attorney, Agent, or Firm*—Donald R. McKenna; Matthew B. Murphy

(57) ABSTRACT

Method of fabricating microstructures on a substrate. The method comprises providing a substrate layer having a first surface with a resist layer. First selected regions of the resist layer are exposed to an environment that renders the resist layer more or less soluble in a developer solution. The resist layer is then developed in the developer solution to expose selected regions of the substrate surface. Second selected regions of the resist layer are then exposed to an environment that renders the resist layer more or less soluble in the developer solution by aligning exposure of the second selected regions to the first selected regions. The first selected regions of the substrate surface are etched. Second selected regions of the resist layer are then developed to expose the second selected regions of the substrate surface.

14 Claims, 8 Drawing Sheets

OTHER PUBLICATIONS

Manz, A. et al., "Electroosmotic pumping and electrophoretic separations for miniaturized chemical analysis systems," *J. Micromech. Microeng.* 4:257–265 (1994).

Ramsey, J.M. et al., "Microfabricated chemical measurement systems," *Nature Med.* 1:1093–1096 (1995).

Seiler, K. et al., "Planar Glass Chips for Capillary Electrophoresis: Repetitive Sample Injection, Quantitation, and Separation Efficiency," *Anal. Chem.* 65:1481–1488 (1993).

Seiler, K. et al., "Electroosmotic Pumping and Valveless Control of Fluid Flow Within a Manifold of Capillaries on a Glass Chip," *Anal. Chem.* 66:3485–3491 (1994).

* cited by examiner

MULTI DEPTH SUBSTRATE FABRICATION PROCESSES

CROSS-REFERENCE TO RELATED APPLICATIONS

This application claims priority to Provisional U.S. patent application No. 60/201,504, filed May 3, 2000, which is hereby incorporated herein by reference in its entirety for all purposes.

BACKGROUND OF THE INVENTION

Manufacturing techniques that are common to the microprocessor, computer and electronics industries have found a variety of new outlets. For example, in the marriage of semiconductor fabrication techniques with biological research, a variety of chip based analytical systems have been developed, i.e., oligonucleotide arrays (See U.S. Pat. No. 5,143,854 to Pirrung et al.) High Throughput screening devices employing microfluidic technology (See U.S. Pat. No. 5,942,443), and lower throughput separations based microfluidic analysis devices (See U.S. Pat. No. 5,976,336).

A number of different fabrication methods have been described for producing microfluidic devices, including photolithography followed by wet chemical etching, injection molding or embossing of plastics, laser ablation, micromachining, and the like. Different fabrication techniques can have different advantages, depending upon the nature of the use that the finished device is to be put. However, for a large number of different applications, silica-based substrates are preferred, e.g., for their chemical inertness, optical properties, and the like. As such, a large proportion of microfluidic devices are fabricated using lithographic/wet chemical etching processes to produce the various features of the devices.

SUMMARY OF THE INVENTION

In a first aspect, the present invention provides a method of fabricating microstructures on a substrate. The method comprises providing a substrate layer having a first surface with a resist layer. First selected regions of the resist layer are exposed to an environment that renders the resist layer more or less soluble in a developer solution. The resist layer is then developed in the developer solution to expose selected regions of the substrate surface. Second selected regions of the resist layer are then exposed to an environment that renders the resist layer more or less soluble in the developer solution by aligning exposure of the second selected regions to the first selected regions. The first selected regions of the substrate surface are etched. Second selected regions of the resist layer are then developed to expose the second selected regions of the substrate surface. The first and second selected regions of the surface of the substrate are then etched.

Another aspect of the present invention is a substrate layer comprising microstructures on a first surface. The substrate layer is produced by a process comprised of providing the substrate layer with a first surface and a first resist layer. The first selected regions of the resist layer are exposed to an environment that renders the resist layer more or less soluble in a developer solution. The first resist layer is developed in the developer solution to expose first selected regions of the substrate surface. Second selected regions of the resist layer are exposed to an environment that renders the resist layer more soluble in the developer solution by aligning exposure of the second selected regions to the first selected regions. The first selected regions of the substrate surface are etched. The second selected regions of the resist are developed to expose second selected regions of the substrate surface. The first and second selected regions of the surface of the substrate are then etched to produce microstructures on the first surface of the first substrate layer.

A further aspect of the present invention is a substrate comprising a first surface, a first resist layer disposed on the first surface, first selected regions of the substrate surface having no resist layer disposed thereon, and second selected regions of the substrate surface. The second selected regions of the substrate surface are aligned with the first selected regions. The second selected regions comprise a developable resist layer.

DETAILED DESCRIPTION OF THE INVENTION

I. General Description

Figure 1A:
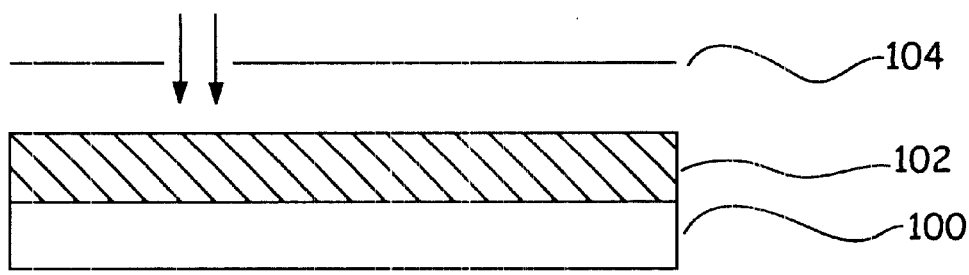
FIGS. 1A–1I schematically illustrates the lithographic fabrication processes of the present invention.

The present invention generally provides improved methods for manufacturing microfabricated structures using lithographic techniques, and particularly photolithographic techniques. In particular, the methods of the invention are applied to fabrication processes that utilize multiple different lithography steps in the production of complex microfabricated structures on substrates. These methods typically involve performing steps in the lithography process by aligning those steps with previous process steps.

Generally, in lithographic techniques, an etchable substrate, e.g., silica based substrates like glass, fused silica, quartz or silicon, is provided having a surface that is to be etched. Typically, a metallic layer is deposited on surface that is to be etched. Such metal layers often comprise chromium, gold or the like, and are generally deposited on the surface by sputtering, or other well known metal deposition methods. For purposes of the present disclosure, the metal layer and/the bare substrate surface, e.g., below the metal layer are interchangeably described as the substrate surface.

An imageable layer is then deposited onto the substrate surface, on top of the metallic layer. Such imageable layers typically comprise polymeric materials termed "resists," which can be selectively imaged by exposure of the resist to particular environments. Specifically, resists generally are rendered more or less soluble in a developer solution depending upon exposure of the resist to a particular environment, e.g., light, heat, or chemical environment. For example, photoresists are typically rendered more or less soluble in their developer solution when they are exposed to light of a particular wavelength, e.g., in the UV range. Following exposure, the more soluble portion is removed or "developed" with the developer solution. For purposes of the present disclosure, the term "developable" refers to a resist that is soluble in its developer solution and thus subject to removal in a developing step. Photoresists that are generally rendered developable (more soluble) by exposure to light are termed positive photoresists, while resists that are rendered nondevelopable (or less developable or soluble) upon exposure to light are termed negative photoresists. Resist layers are typically deposited on the surface of the substrate (optionally metal plated surface) using well known coating methods like spin coating, spray coating, chemical vapor deposition or simple immersion coating. A large number of photoresists, in particular, are generally known and commercially available, including photoimagable polyimides (e.g., PI-2729, available from HD M+icrosystems), photoimagable benzocyclobutenes (e.g., Cyclotene 4026 available from Dow Chemical), photoimagable epoxies (e.g., SU-8, available from MicroChem. Corp), Novolac based positive photoresists (e.g., AZ P-4000, available from Clarient), cardo type photopolymers (e.g., V-259-PA, available from Nippon Steel Chemical Co.), and the like. Such polymers are generally commercially available and are generally described in, e.g., Wayne M. Moreau, Semiconductor Lithography: Principles, Practices and Materials (Microdevices: Physics and Fabrication Technologies), which is incorporated herein by reference.

The resist layer is then exposed, typically in selected locations to render portions of the resist layer developable. Those portions of the resist layer are then removed using an appropriate developer solution. Removal of the resist layer exposes the substrate surface/metal layer. The metal layer is then removed in the exposed regions, e.g., using $KI/I_2$ for gold layers or $K_3Fe(CN)_6$/NaOH for chrome layers, leaving the bare substrate exposed in the selected regions, to create an etch mask on the surface of the substrate. The exposed bare substrate is then etched using an appropriate etchant, e.g., $HF/NH_4F$ for silica based substrates, to produce structures, e.g., depressions, grooves, etc., in the substrate surface.

In a first aspect, the present invention provides a method of fabricating microstructures on a substrate. In these methods, a substrate layer having a first surface is provided. A first resist layer that is to be used in the lithography process is also provided disposed on the substrate surface. Optionally, as described above, a metallic layer, e.g., chromium, gold, etc., is provided over the surface of the substrate before the resist layer is deposited thereon, in order to finction as an etching mask. The resist is then deposited onto the metal layer that occupies the surface of the substrate. Any of a variety of different resists are useful in accordance with the present invention with photoresists being most preferred for their ease of use and flexibility in lithographic processes.

When a manufacturing process utilizes more than one lithography step, the remaining resist layer is typically stripped off after the etching step (either the etching of the metal layer or the etching of the substrate surface, and a new resist layer is applied. However, it is often very difficult to apply an appropriate even resist coating to surfaces that have topographical features, e.g., depressions, grooves, etc., that are greater than 1 μm deep. As such, it is difficult and impractical to re-expose and develop existing structures, i.e., to make them deeper. In any event, the new resist layer is selectively exposed and developed, and the substrate surface is again etched.

As can be seen, the above described process requires repeating each of the process steps for each lithography step involved in the overall fabrication. Further, where lithographically produced structures or features that are produced in separate steps are intended to be spatially aligned with one another, alignment of subsequent exposure and development steps with the features produced in previous etching steps can be laborious, inexact and difficult. In particular, because one cannot practically overlap first and second etch steps, because of the resist coating problem, one must very precisely align the second etch step with the first.

The present invention, however, utilizes a single resist coating in multiple serial lithography steps to eliminate or substantially reduce these problems. By using a single resist layer in two or more lithography steps, time, cost and alignment issues associated with prior methods are at least partially alleviated. Specifically, because a single resist coating is used, a second resist coating step is eliminated. Further, because the second etch step overlaps the first etch step, one can more easily align those steps, as described in greater detail below.

In accordance with the present invention, a first pattern of the resist layer is exposed to the environment that affects the resist layer, such that selected regions of the resist layer are exposed. The resist layer is developed to remove portions of the resist layer (which either correspond to the exposed layers or the unexposed layers) and expose first selected regions of the substrate surface. Typically, development is carried out in accordance with the particular resist type that is used.

Following the first developing step, a second pattern of the resist layer (and substrate surface) are exposed to the environment that affects the resist layer, such that first selected regions of the substrate surface are exposed and second selected regions of the resist layer have been exposed but not yet developed. Following the second exposure step, the exposed regions of the substrate surface are etched. The overall process is schematically illustrated in FIG. 1. For ease of discussion, the following examples and figures are described with reference to photolithographic techniques, using irradiation of the resist with light of appropriate wavelengths to provide the environment that affects the nature of the resist. However, it will be appreciated that other lithographic techniques, using different types of resists are equally applicable to the methods described below. In such cases, the below described irradiation steps optionally take the form of exposure of the resist layer to thermal or chemical environments.

As illustrated in FIG. 1A, a first substrate 100 is provided with a layer of resist 102 on at least one surface of the substrate 100. At least a portion of the resist layer is subjected to an environment that affects the resist. As shown, the resist layer 102 comprises a photoresist and is exposed to light (shown as arrows) in selected regions. Typically, this is accomplished through the use of a photomask 104, but is optionally carried out using different methods, e.g., laser writing, e-beam lithography, etc. Although generally described in terms of a positive photoresist, negative photoresists are equally useful in the present invention, using inverse masking strategies from those described below. Similarly, although illustrated in terms of photoresists, as noted herein, other resists are equally useful in the methods described herein.

Figure 1B:
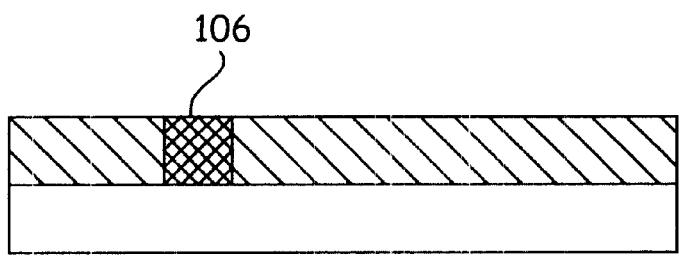
Figure 1C:
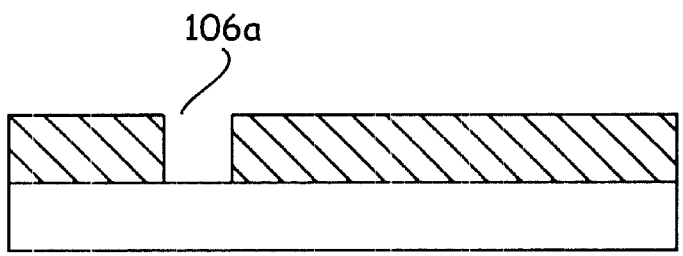

Following irradiation, a portion of the resist layer becomes more soluble in a developer solution. As shown in FIG. 1B, the irradiated portion becomes more soluble, as indicated by cross-hatching in portion 106. In this instance, the resist would be characterized as a positive photoresist. The resist and substrate are then immersed or washed with the developer solution, which solubilizes and removes the irradiated portion of the resist in region 106a, from the surface of substrate 100 as shown in FIG. 1C. This results in an exposed portion of the substrate surface that corresponds to the irradiated portion of the resist layer.

Figure 1D:
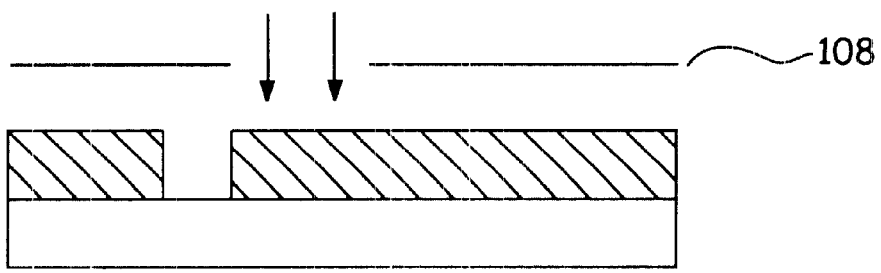

In FIG. 1D, a second region of the resist layer is irradiated through an additional photomask 108, rendering a second selected portion 110 of the resist layer more soluble in the developer solution. In preferred aspects, the second irradiation step is aligned with the exposed substrate surface 106a, from the previous step. For example, the photomask 108 is aligned over the substrate and resist layer by positioning it at a particular, e.g., predetermined, point relative to the pattern of the exposed substrate surface, e.g., 106a.

Figure 1E:
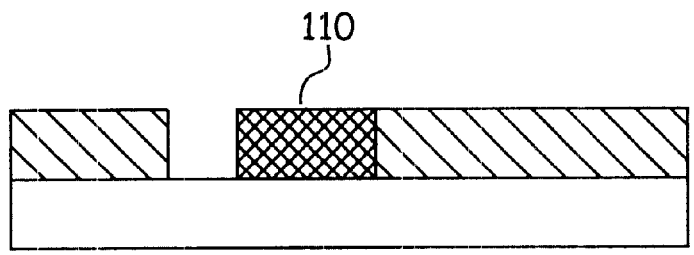
Figure 1F:
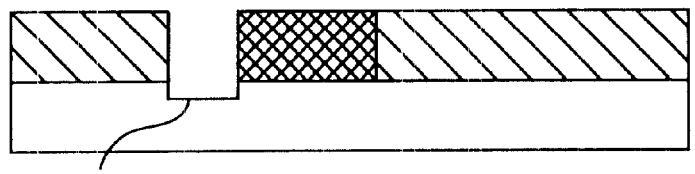

Unlike the previous developing steps, e.g., shown in FIG. 1B, the second irradiated portion 110 of the resist layer is not removed from the substrate surface at this stage (FIG. 1E). Instead, the exposed portion of the substrate surface is etched to form a first depression, cavity or groove 106b in the substrate (FIG. 1F). In certain embodiments, the latent image from the second exposure step may be stabilized in the resist layer, e.g., by baking the resist coated substrate after the second exposure step, but prior to the first etching step. Typically, the bake step is carried out at temperatures that are typical for resist softbake steps, e.g., approximately 90 to 100° C. for 30 minutes. This baking step serves to stabilize the latent image from the second exposure, as well as hard bake the resist to improve etch resistance for the resist layer, which under the process of the invention, will be exposed to two etch steps.

Figure 1G:
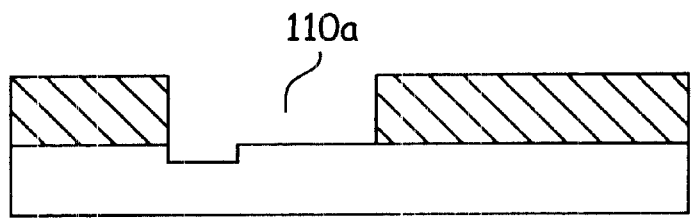
Figure 1H:
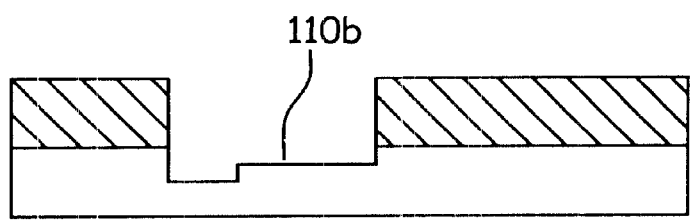
Figure 1I:
Figure 2A:
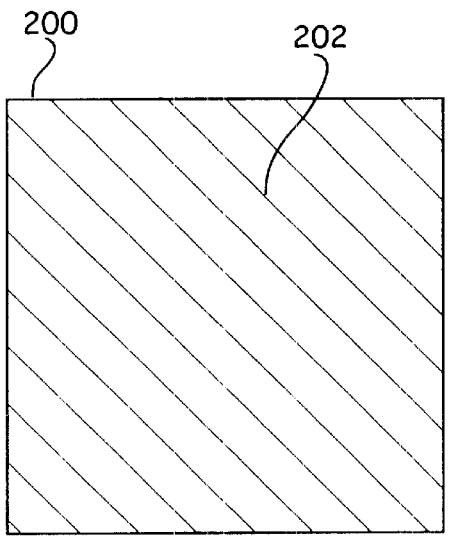
FIGS. 2A–H illustrates a typical photolithographic process for fabricating multi-depth structures on a substrate.
Figure 2B:
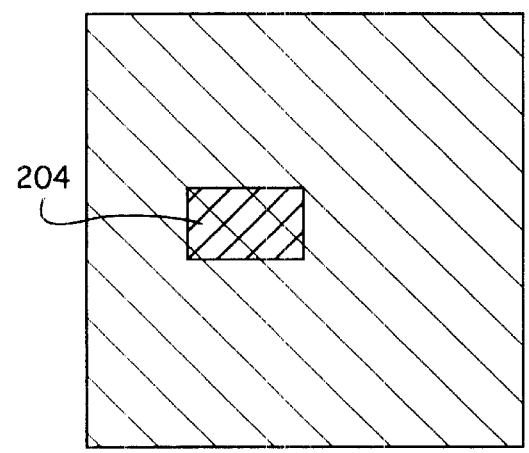
Figure 2C:
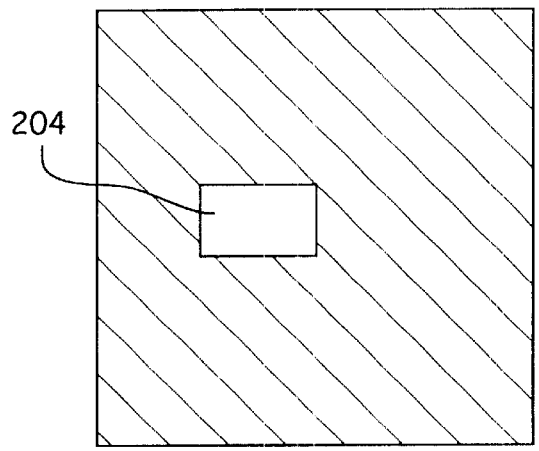
Figure 2D:
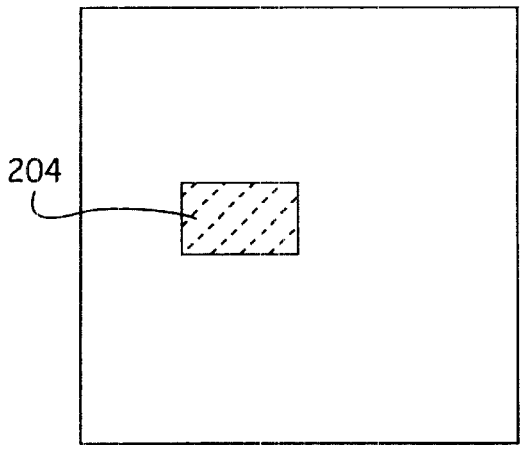
Figure 2E:
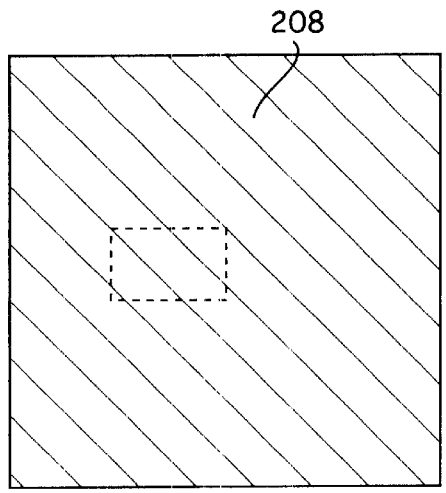
Figure 2F:
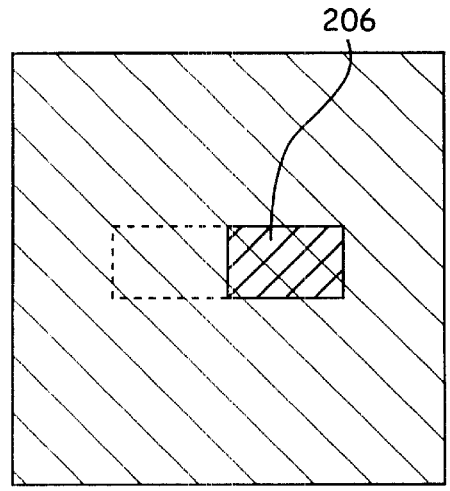
Figure 2G:
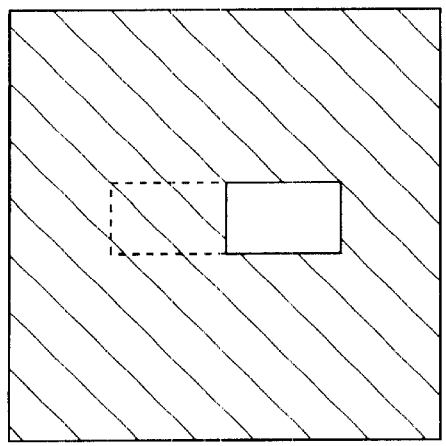
Figure 2H:
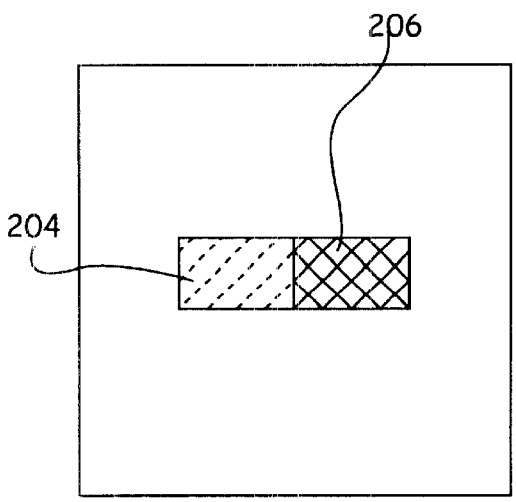
Figure 3A:
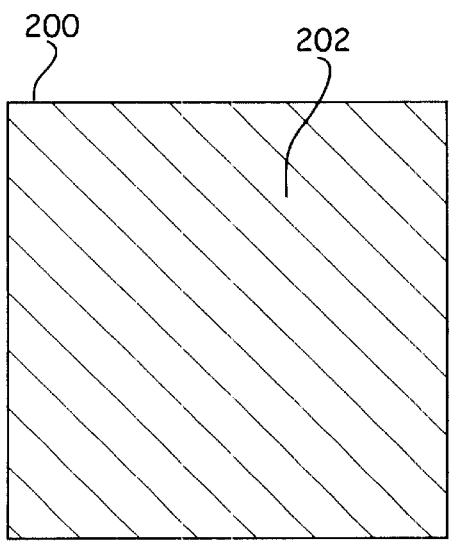
FIGS. 3A–3G schematically illustrates the methods of the invention when used to photolithographically produce a similar multi-depth structures illustrated in FIG. 2.
Figure 3B:
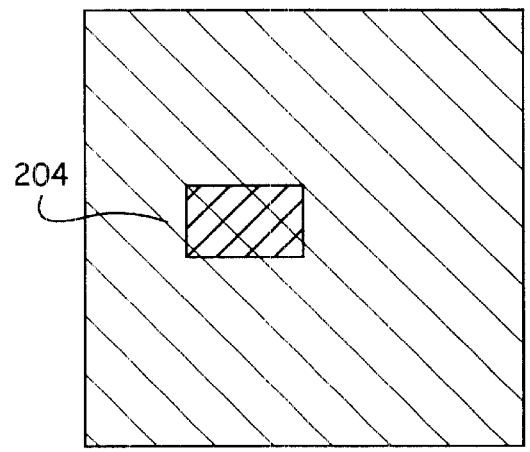
Figure 3C:
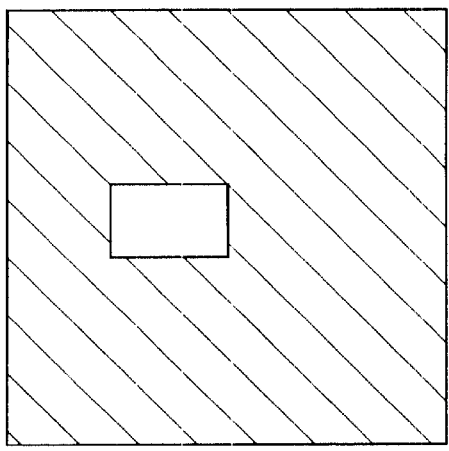
Figure 3D:
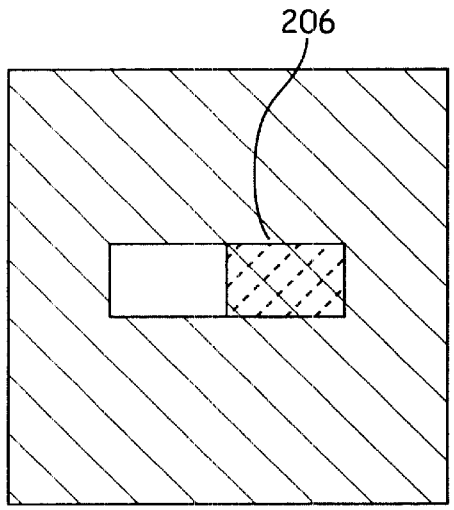
Figure 3E:
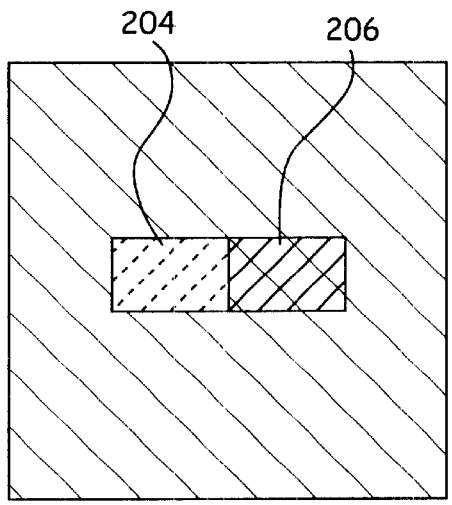
Figure 3F:
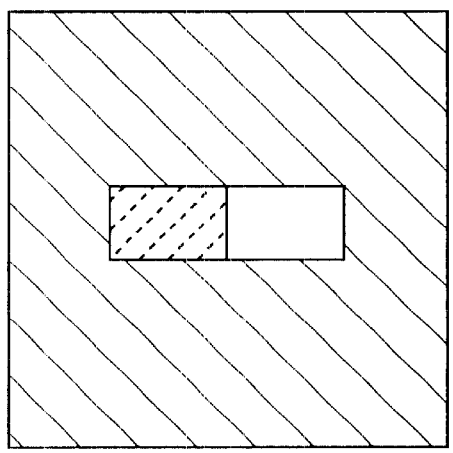
Figure 3G:
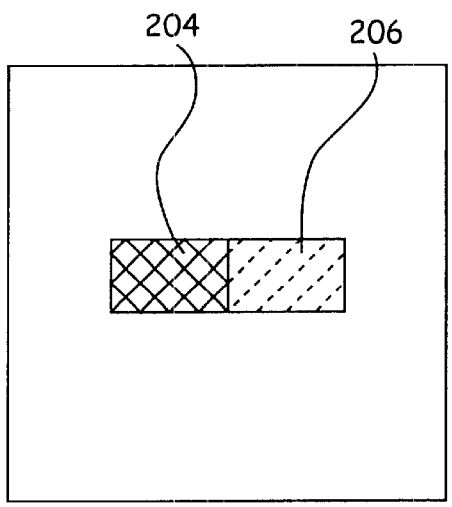

Following the etching step, the second selected portion of the resist layer 110 is removed to expose a second selected portion of the substrate surface 1 10a (FIG. 1G). The entire exposed portions of the substrate surface, e.g., 106b and 110a, are then subjected to another etching step (FIG. 1H). This results in further etching of depression 106b, in addition to fabrication of another depression 110b corresponding to exposed region 110a, where depression 106b is deeper than depression 110b. Deeper etch steps can be carried out by etching certain regions for longer periods of time, in addition to the extended times from double etching.

At the completion of the desired process, the resist layer is completely removed to reveal the finished substrate (FIG. 1I), or to allow subsequent fabrication steps to be carried out, e.g., bonding of additional layers to the substrate, or other fabrication processes, e.g., machining, chemical treatment, i.e., coating, etc.

By combining multiple etching steps using only a single resist layer, one is able to save substantial amounts of time in fabrication of more complex structures in substrate surfaces. Further, by using the results of a prior developing step to align a subsequent exposure step, one can produce more accurately aligned structures, where they are made in different steps. In particular, the portion of the substrate etched in the first step is re-etched to form the deeper etch. As a result of this and the anisotropic nature of silica etching, alignment tolerances can be far less stringent. Specifically, the anisotropy of the etching process allows the second or shallow etch to be less carefully aligned with the first or deeper etch, because the deeper etch will expand more broadly than the shallower etch, capturing any minor misalignment of the shallower etch with the deeper etch.

Both of these advantages can be illustrated in an exemplary fabrication process where one desires to fabricate one or more depressions in a planar substrate, e.g., for a microfluidic channel network, where the grooves have at least two different depths. This process is comparatively illustrated in FIGS. 2 and 3.

FIG. 2 schematically illustrates a typical process for fabricating a double depth channel or groove network in a planar substrate. As shown, a planar substrate 200 is provided with a resist coating 202. A first region 204 or portion of the resist layer is irradiated to render that portion more soluble or developable in the developer solution (as illustrated by the hatched region 204 in FIG. 2B). The overall substrate is then developed to remove the irradiated portion of the resist layer in region 204 and etched to yield a depression in region 204 (as indicated by the diagonal dashes) in the substrate surface, and the overall resist layer is removed (FIG. 2D). A subsequent resist coating 208 is applied to the substrate (FIG. 2E) which covers the previously etched depression in region 204 (as shown by the dashed outline in FIG. 2E). Because of the difficulty in providing an appropriate resist coating over the altered topography of region 204, one cannot readily overlap the second exposure, development and etching steps with the first set of steps. As a result, in order to etch a double depth structure network, the second region 206 is exposed, after very carefully aligning it with the first etched region 204 (FIG. 2F). The second region 206 is then developed and the resist layer is removed from this region (clear region in FIG. 2G). This second region 206 is then etched deeper than the first region (as indicated by cross-hatching in FIG. 2H), yielding a substrate that includes a shallow depression in region 204 and a deep depression in region 206 (FIG. 2H).

FIG. 3 schematically illustrates a process according to the present invention, used to fabricate a similar structure network to that shown in FIG. 2. Common elements between FIGS. 2 and 3 utilize the same reference numerals. Again, as with FIG. 2, a substrate 200 is provided with an appropriate resist layer or coating 202. A first region 204 of substrate and its accompanying resist layer is irradiated (shown as a hatched region in FIG. 3B) and developed (shown as a clear region in FIG. 3C). Before the first etching step is carried out, a second region 206 is irradiated (shown as a hatched region in FIG. 3D). The second region 206 is irradiated, but is not developed before etching the first portion 204 (the region indicated by the diagonal dashes in FIG. 3E). The second region 206 is then developed (shown as a clear region in FIG. 3F) and etched, which etching step also more deeply etches the first region 204 (now shown by cross-hatching) than the second region 206 (now indicated by diagonal dashes in FIG. 3G), to yield the desired double depth structure. As these examples illustrate, there is no need for an additional resist coating removal and/or re-coating step. Further, alignment of the second portion with the first portion is substantially easier because the first region is re-etched, and thereby expanded to encompass a greater margin of error in alignment.

Although described in terms of a relatively small number of etching steps, it will be appreciated that the methods of the present invention can be repeated multiple number of times to yield far more complex structures than those illustrated in FIGS. 2 and 3. In particular, multiple different regions of the resist coating are serially exposed, developed and etched to produce substrates having complex depth profiles, e.g. three, four, five or more different depths. Similarly, although described in terms of microfluidic channel networks, it will be appreciated hat a variety of structures, e.g., fluidic and otherwise, can be fabricated by the methods described herein.

Although the present invention obviates the need for resist re-coating steps in many fabrication processes, in some cases, additional re-coating steps and other fabrication steps, e.g., bonding additional layers, etching additional layers, etc., may be used, in conjunction with the presently described processes, to produce more complex structures.

II. Fabrication of Microfluidic Channel Networks

As noted above, the methods described are particularly useful in the lithographic fabrication of microfluidic channel networks, and specifically networks that include channels of varying depths.

In preferred aspects, microfluidic devices are fabricated from aggregate layers of planar substrates, where the channels are defined at the interface of the layers. For example, in some cases, a first substrate having a first planar surface is provided. A series of grooves is fabricated into the planar surface of the substrate, where the groove pattern corresponds to the desired pattern of channels in the ultimate device. A second planar layer is overlaid onto the planar surface of the first substrate and the substrates are bonded or fused together, such that the grooves become sealed conduits or tunnels through the overall device. Ports/reservoirs are optionally provided in one or more of the substrate layers, which ports or reservoirs are positioned to be in communication with one or more of the sealed conduits. These ports or reservoirs provide access points for the conduits within the device, e.g., for introducing fluids or other materials, or for providing a control interface for those conduits, e.g., for flow control, temperature control, etc. Additionally, such reservoirs or ports can provide storage for fluids, e.g., buffers and other reagents that are to be manipulated within the conduits.

Microfluidic systems can be fabricated to have complex networks of intersecting channels, depending upon the application for which the devices are to be put. See, e.g., U.S. Pat. No. 5,976,336 to Dubrow et al. In many instances, it is desirable not only to introduce complexity into the basic channel layout, but also into the relative dimensions of the channels within a given network. For example, U.S. Pat. No. 5,842,787 describes channel networks that include channels that vary in depth and or width, in order to accomplish a variety of different goals. Published International Application No. WO 98/55852 describes channels having fluid stops that typically comprise shallow or widening regions of the channel, to allow for differential filling of channel networks. U.S. Pat. No. 6,042,709 describes the use of double depth channels to alleviate the effects of pressure fluctuations at channel intersections.

As described above, the methods of the present invention are particularly useful in fabricating channel networks that include channels of different depths. In particular, deeper channels are subjected to two or more etch steps while shallower channels are subjected to fewer etch steps. Because these methods do not require re-coating and re-exposing the deeper channels, they do not suffer from the issues of alignment that such methods can have.

Figure 4:
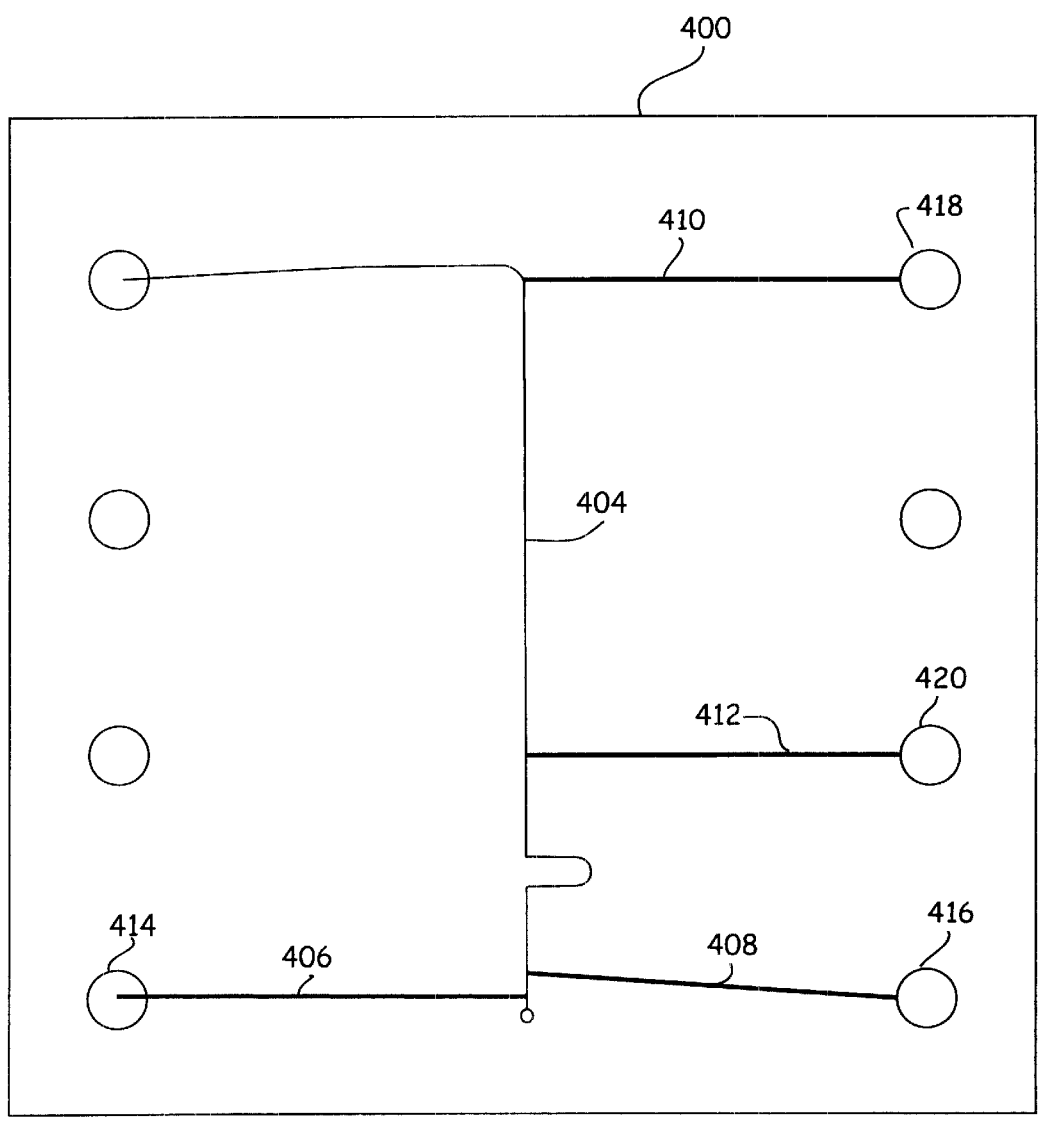
FIG. 4 schematically illustrates a double depth channel layout for a microfluidic device.

FIG. 4 is an illustration of a microfluidic device 400 having a channel layout that incorporates channels of differing depths. In particular, the channel layout show is designed to flow fluid materials along the main channel portion 404. Additional fluid materials are brought into the main channel from reservoirs 414 and 416, via side channels 406 and 408, respectively. In order to manipulate certain materials in the main channel, an electric field is applied to a portion of the main channel 404 by applying a voltage differential between reservoirs 418 and 420, which are connected to channel 404 via side channels 410 and 412, respectively. In order to regulate the amount of fluid entering channel 404 via side channels 406, 408, 410 and 412, either via pressure forces for channels 406 and 408 or electrokinetic forces in channels 410 and 412, these side channels are provided having shallower depths than main channel 404. Typically, the main channel is from about 2 to about 20 times deeper than the side channels, and preferably in the range of from about 5 to about 10 to 15 times deeper than the side channels.

Figure 5A:
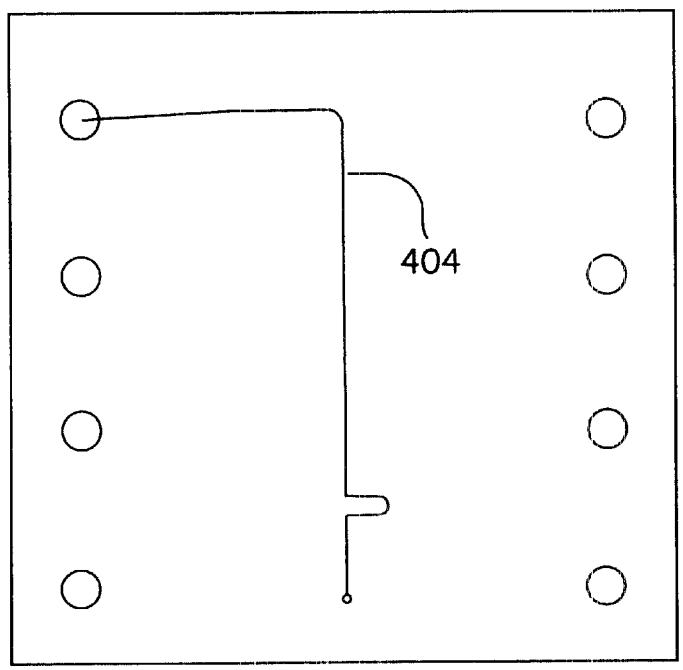
FIGS. 5A and 5B illustrate the mask/etch layers used to fabricate the double depth channel layout shown in FIG. 4.
Figure 5B:
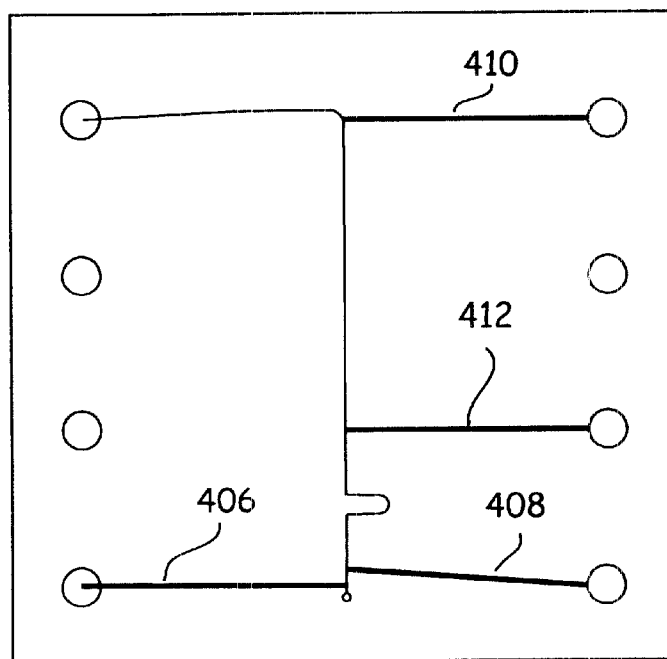

FIG. 5 illustrates the mask layers used to fabricate the channel layout illustrated in FIG. 4. In particular, FIG. 5A illustrates the first mask/etch step that produces the first pass at the deep portions of the channel network, e.g., main channel 404. The second mask layer/etch step is illustrated in FIG. 5B, which produces the first pass at etching the shallow channels, e.g., channels 406, 408, 410 and 412. The second etch step also takes a second etch pass at the deeper etched portion (channel 404). In the case of channel networks where the deep portions are 10 times deeper than the shallow regions, then the first etch step etches approximately 90% of the depth of those deep portions, while the second etch etches the remaining 10% of the depth, as well as 100% of the depth of the shallow channels.

All publications and patent applications are herein incorporated by reference in its entirety for all purposes to the same extent as if each individual publication or patent application was specifically and individually indicated to be incorporated by reference. Although the present invention has been described in some detail by way of illustration and example for purposes of clarity and understanding, it will be apparent that certain changes and modifications may be practiced within the scope of the appended claims.

What is claimed is:

1. A method of fabricating microstructures on a substrate, comprising the following steps in the order named:
    a) providing a substrate having a first surface and a first resist layer disposed thereon;
    b) exposing first selected regions of the first resist layer to an environment that renders the first resist layer more soluble in a developer solution;
    c) developing the first resist layer in the developer solution to expose first selected regions of the first surface;
    d) exposing second selected regions of the resist layer to an environment that renders the resist layer more soluble in the developer solution;
    e) etching the first selected regions of the first surface;
    f) developing the first resist layer to expose second selected regions of the first surface; and
    g) etching the first and second selected regions of the first surface.

2. The method of claim 1, wherein steps e) and g) provide etches of differing depths.

3. The method of claim 1, wherein at least a portion of the second selected regions overlaps with at least a portion of the first selected regions.

4. The method of claim 1, wherein the etches of steps e) and g) provide etches of substantially equal depths.

5. The method of claim 4, wherein at least a portion of the second selected regions overlap with at least a portion of the first selected regions, resulting in a deeper etch in an overlapping portion of the first and second selected regions than in a non-overlapping region of the first and second selected regions.

6. The method of claim 1, wherein at least a portion of the essentially of glass.

7. The method of claim 1, wherein the substrate consists essentially of quartz.

8. The method of claim 1, wherein the etched first and second selected regions comprise channel patterns, each channel in a channel pattern comprising a width of less than 1000 $\mu$m.

9. The method of claim 1, wherein the etching step of step e) is carried out for a longer period of time than an etching step of step g).

10. The method of claim 9, wherein the etching of step e) produces a first groove or series of grooves in the first surface of the substrate, and the etching in step g) produces a second groove or series of grooves in the surface of the substrate, a portion of the groove(s) in the second series of grooves overlapping with the first series of grooves, the second series of grooves comprising a different depth from the first set of grooves produced in step e).

11. The method of claim 1, wherein the first resist layer comprises a first photoresist layer, and exposing steps b) and d) comprise exposing the first and second selected regions, respectively, to light at an appropriate wavelength to render the resist more soluble.

12. The method of claim 11, wherein the first photoresist layer comprises a positive photoresist.

13. The method of claim 1, wherein exposing step d) comprises aligning the second selected region with the first selected region.

14. The method of claim 1, further comprising the step of baking the resist layer after step d) but before step e).

* * * * *

UNITED STATES PATENT AND TRADEMARK OFFICE
CERTIFICATE OF CORRECTION

PATENT NO. : 6,569,607 B2 Page 1 of 1
DATED : May 27, 2003
INVENTOR(S) : McReynolds It is certified that error appears in the above-identified patent and that said Letters Patent is hereby corrected as shown below:

<u>Column 8,</u>
Line 60, please delete "at least a portion of the" and insert -- the substrate consists --.

Signed and Sealed this

Twenty-third Day of March, 2004

JON W. DUDAS
*Acting Director of the United States Patent and Trademark Office*